US006475298B1

(12) United States Patent
O'Donnell et al.

(10) Patent No.: US 6,475,298 B1
(45) Date of Patent: Nov. 5, 2002

(54) POST-METAL ETCH TREATMENT TO PREVENT CORROSION

(75) Inventors: Robert J. O'Donnell, Fremont; Gregory J. Goldspring, Alameda, both of CA (US)

(73) Assignee: Lam Research Corporation, Fremont, CA (US)

( * ) Notice: Subject to any disclaimer, the term of this patent is extended or adjusted under 35 U.S.C. 154(b) by 30 days.

(21) Appl. No.: 09/687,957

(22) Filed: Oct. 13, 2000

(51) Int. Cl.$^7$ ................................................. C23C 8/00
(52) U.S. Cl. ...................... 148/240; 148/280; 427/250; 427/333; 427/377; 427/379; 438/476; 438/477; 134/21
(58) Field of Search ................................. 148/240, 280; 427/250, 333, 377, 379; 438/476, 477; 134/21

(56) References Cited

U.S. PATENT DOCUMENTS

| | | | |
|---|---|---|---|
| 5,714,036 A | * 2/1998 | Wong et al. | 134/1.3 |
| 5,795,831 A | 8/1998 | Nakayama et al. | 438/714 |
| 5,882,489 A | 3/1999 | Bersin et al. | 204/192.35 |
| 6,162,733 A | * 12/2000 | Obeng | 134/1.2 |

OTHER PUBLICATIONS

Louis, et al., "Addressing Corrosion Issues", Future Fab Int'l 1998, Issue 5, Technology Publishing Ltd., UK, pp. 271–3, (no month data).

Aoki, et al., "After–Corrosion Suppression Using Low-–Temperature Al–Si–Cu Etching", July, 1991, Jap. Jrnl of Applied Physics, vol. 30, No. 7, pp. 1567–70.

Mayumi et al., "Post–Treatments for Reactive Ion Etching of Al–Si–Cu Alloys", Aug. 1990, J. Electrochem. Soc., vol. 137, No. 8., pp. 2534–2538.

Parekh et al., "Cl Level Effects on Corrosion for Various Metallization Systems", Jul. 1990, J. Electrochem. So., vol. 137, No. 8., pp. 2199–2202.

Proost et al., "Chemical and Electrial Characterization of the Interaction of $BCl_3$/$Cl_2$ Etching and $CF_4$/$H_2$O Stripping Plasmas with Aluminum Surfaces", Jun. 1999, J. Electrochem.Soc., vol. 146/11, pp. 4230–4235.

Li et al, "Analyses of Post Metal Etch Cleaning in Downstream $H_2$ O–Based Plasma Followed by a Wet Chemistry", Mar. 1999, J.Electrochem.Soc., vol. 146/10, pp. 3843–3851.

Czuprynski et al., "X–ray photoelectron spectroscopy analyses of metal stacks etched in $Cl_2$/$BCl_3$ high density plasmas", Feb. '98, J. Vac. Sci. Technol. B 16(1), pp. 147–158.

Ha et al., "Aluminum Etch and After–Corrosion Characteristics in a m=0 Helicon Wave Plasma Etcher", Dec. 1998, Jpn. J. Appl. Phys., vol. 37, pp. 6928–6933.

Czuprynski et al, "Efficiency evaluation of postetch metal stack anticorrosion treatments using chemical analyses by x–ray photoelectron spectroscopy and wide dispersive x–ray fluorescence", Aug. '97, J. Vac.Sci. Technol. B 15(4), pp. 1000–1007.

Lee et al., "Reactive ion etching induced corrosion of Al and Al–Cu films", Apr. 1981, J.Appl.Phys. 52(4), pp. 2994–2999.

Whetten et al., "Incorporation of chlorine during chlorine reactive ion beam etching of aluminum–copper alloys", Jun. '86, J.Vac.Sci.Technol. A4(3), pp. 586–589.

* cited by examiner

Primary Examiner—John Sheehan
Assistant Examiner—Andrew L. Oltmans
(74) Attorney, Agent, or Firm—Beyer Weaver & Thomas, LLP

(57) ABSTRACT

A method of improving the post-etch corrosion resistance of aluminum-containing wafers by performing a two-step post-etch passivation sequence which does not involve a plasma. In the first step the pressure is high, relative to typical passivation procedures, and the wafer temperature is relatively low. In the second step, the pressure is ramped down and the wafer temperature is ramped up. This two-step approach results in a more-efficient removal of chlorine from the wafer, and hence improved corrosion resistance.

14 Claims, 2 Drawing Sheets

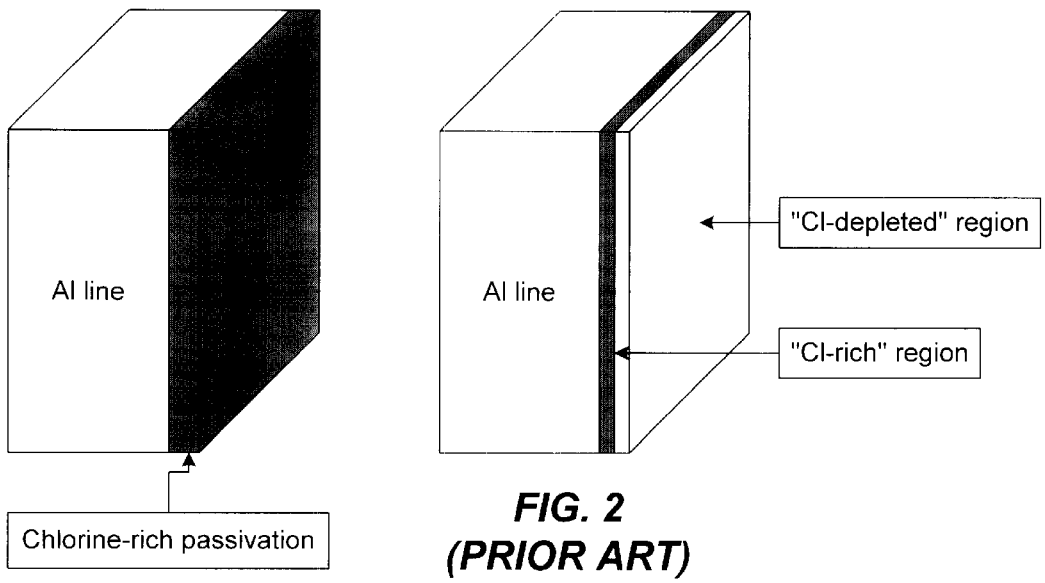
**FIG. 1
(PRIOR ART)**
**FIG. 2
(PRIOR ART)**
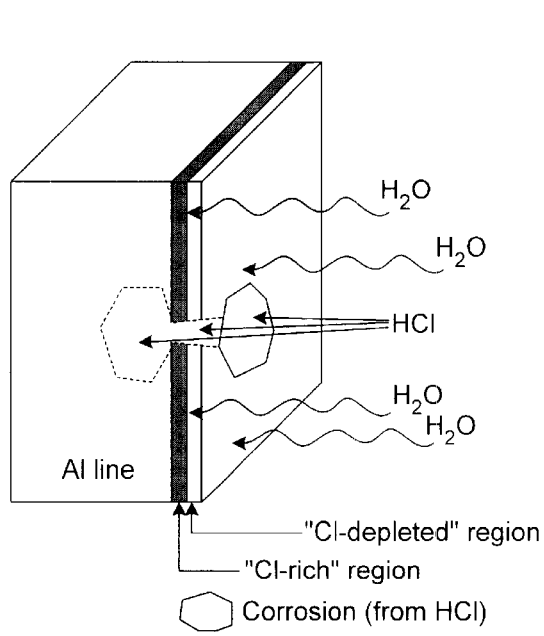
**FIG. 3
(PRIOR ART)**
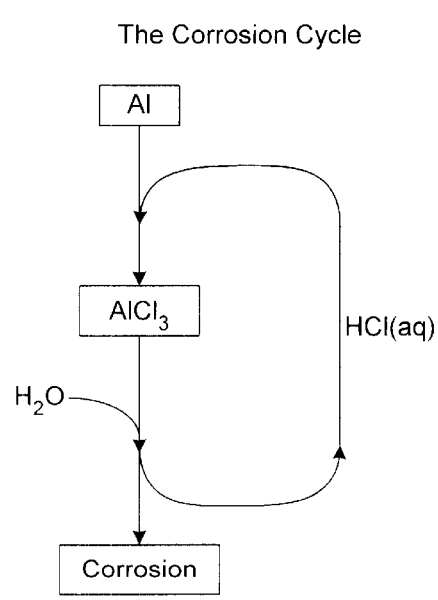
**FIG. 4
(PRIOR ART)**

POST-METAL ETCH TREATMENT TO PREVENT CORROSION

FIELD OF THE INVENTION

The present invention relates to integrated circuit manufacture. More particularly, the present invention relates to the post-etch passivation of metalized layers within semiconductors.

BACKGROUND OF THE INVENTION

Solid state devices, including semiconductors and integrated circuit devices (ICs) are manufactured in four distinct stages. They are material preparation, crystal growth and wafer preparation, wafer fabrication, and packaging. Wafer fabrication is the series of processes used to create the semiconductor devices in and on the wafer surface. The polished starting wafers enter fabrication with blank surfaces and exit with the surface covered with hundreds of completed chips.

Wafer fabrication facilities produce billions of chips world-wide, with thousands of different functions and designs. Even with this daunting diversity of device types, the basic processes which are used to form solid state devices are no more than four: layering, patterning, doping, and heat treatment.

Each of these broad processes may be further broken down. One means of patterning one or more layers formed on of a wafer during fabrication is etching. Patterning is often commenced by laying down a mask layer. One type of mask is a photoresist. Etching can be used, in conjunction with other steps such as photoresist deposition, to form a variety of features through one or more layers in an integrated circuit or other solid state device. Some of these layers are metalized, and aluminum is one metal used to form these metalized layers.

The etching of aluminum presents problems that must be overcome in order to reliably produce commercial quantities of solid state devices which are reliable and which achieve the design objectives for the device. During aluminum etching, chlorine is incorporated into the photoresist and a relatively "chlorine-rich" material is deposited on the aluminum sidewalls; this situation is represented graphically in FIG. 1. The specific composition, thickness, and amount of Cl incorporated in the sidewall deposition is highly dependant on factors such as the type of photoresist and the etch chemistry.

In some cases the sidewall deposition can be relatively thin, e.g. $Cl_2/BCl_3$ etching with I-line resist. In other cases the sidewall deposition can be hundreds of angstroms thick, for instance $Cl_2/BCl_3/CHF_3$ etching with DUV resist. For thicker depositions, the typical corrosion passivation processes can result in a situation in which the entire thickness is not depleted of chlorine. Instead, a Cl-depleted region may be formed on an outer layer as a result of the sidewall passivation. This region may be substantially chlorine-free but a "chlorine-rich" rich region exists between the depleted surface and the aluminum line. See FIG. 2.

In order to limit the deleterious effects of corrosion, especially ongoing corrosion, within the solid state device, one of the steps commonly taken is corrosion passivation. This is especially true of metals which tend to form substantially impermeable oxides, such as aluminum.

In general, corrosion passivation results from allowing the corrosion process to begin while breaking the cycle before a significant amount of corrosion can form. Most prior corrosion passivation procedures depend on a $H_2O$-based plasma to react with residual chlorine to form HCl, which is removed from the wafer surface. The photoresist is stripped off with an $O_2$-based plasma process either concurrently or in a subsequent processing step. Ideally, this sequence will remove essentially all of the residual chlorine on the wafer. However, it has been observed that such current passivation methodologies may not remove all the chlorine on the surface of a wafer. Accordingly, they may result in a low "corrosion margin", or the window of time before formation of detectable amounts of corrosion. This is especially true for "next generation" aluminum etch processes which involve DUV photoresists and aluminum etch processes containing $CHF_3$ or $N_2$, all of which result in relatively thick deposition on the aluminum sidewall.

In order to investigate a more effective passivation methodology, it is well to study the formation of "classic" corrosion. An overview of one corrosion mechanism of significant concern in the solid state industry, including a general mechanistic sequence follows. The exact mechanisms for the formation of classic corrosion are complicated and have not been completely elucidated, but a reasonably general mechanistic sequence, with an identification of the critical factors, is presented below.

It is known that substantially any chlorine remaining on the aluminum wafer after the passivation process will result in the formation of corrosion when the wafer is exposed to ambient humidity.

1) Transport of Water to the Wafer Surface: The first step in the formation of corrosion occurs when water from the ambient environment diffuses to the surface of the wafer. The flux of water to the wafer, and the resulting equilibrium surface $H_2O$ concentration, will be controlled by the absolute concentration of water in the vapor: i.e., the higher the ambient water concentration, the greater the surface concentration of water.

2) $H_2O$ Diffusion. Before corrosion can form, the water on the surface of the wafer must diffuse to the Cl-rich region. The rate of water diffusion will be effected by temperature. The higher the temperature, the faster the diffusion. The amount of water diffusing into the sidewall will be controlled by the equilibrium concentration of water on the wafer surface. The higher the surface concentration, the larger the $H_2O$ flux to the corrosion site.

3) The Corrosion Cycle Begins. Water reacts with the residual Cl to form HCl, which further reacts to form corrosion. A typical reaction scheme is presented in Equations1–3:

  (I)

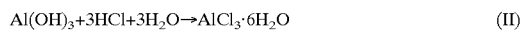  (II)

  (III)

The rate at which HCl is formed will depend on the concentration of residual chlorine and the amount of water that has diffused through the film. Note that water plays a key role because it acts as a catalyst for the overall corrosion reaction. The rate of each reaction is strongly dependant on the temperature the higher temperature, the faster the reaction. Moreover, while a typical reaction scheme is shown here, other reaction sequences that form corrosion may also be present. The invention taught hereinafter is not necessarily dependent on any one of these reaction sequences.

4) The Corrosion Cycle Accelerates. HCl reacts with pure aluminum to form $AL_xCl_y$, which subsequently reacts with $H_2O$ to form corrosion and more HCl, see Equation IV below.

$$3HCl + 3H_2O + Al \rightarrow AlCl_3 + 3H_2O \rightarrow Al(OH)_3 + 3HCl \quad (IV)$$

This cycle continues until the corrosion site breaks through the sidewall passivation and continues to grow on the outside of the aluminum line, as shown at FIG. 3. As the local concentration of water and HCl increases, the amount and rate of corrosion formation also increases. The corrosion cycle will continue for as long as there are present $H_2O$, Cl, and Al, which form the reactants. See FIG. 4.

The typical passivation procedure occurs at conditions that serve to impede the diffusion of water and hence reduce the effectiveness of the passivation process. Specifically, these inefficiencies are as follows:

1) The entire passivation sequence is carried out at low pressure. The typical pressure range s 2–4 Torr. At these low pressures the concentration of water in the chamber is relatively low, which reduces the amount of water transported to the wafer surface, and ultimately lowers the flux of water to the Cl-rich region. This has the effect of slowing the passivation process.

2) The entire passivation sequence is carried out at high wafer temperatures. The wafer temperature range for the typical passivation methodology is 220–275° C. These high temperatures have the effect of driving off $H_2O$ as well as HCl, which results in a reduction of the amount of water available for participation in the passivation process. This also has the effect of slowing the passivation process.

3) The passivation process is typically a plasma process. The plasma for the typical passivation methodology either consists solely of $H_2O$ or a mixture with typical photoresist strip gasses including but not limited to $O_2$, $N_2$, and $CF_4$. The products of the plasma process have the effect of oxidizing the metal incorporated into the sidewall passivation during the aluminum etch, which can result in the creation of an "oxidized skin" on the outer surface of the sidewall passivation. See FIG. 2. This can have the effect of trapping chlorine beneath the skin, thereby setting the stage for future corrosion and decreasing the effectiveness of the $H_2O$ passivation. This is because the $H_2O$ must diffuse through the oxidized layer before reacting, and the HCl must diffuse out before it can be removed.

Based on this conceptual understanding, what becomes clear is that temperature and absolute concentration of water in the vapor are critical parameters for the formation of corrosion, and hence for corrosion passivation. Accordingly, it is for the formation of corrosion, and hence for corrosion passivation. Accordingly, it is desirable to control at least one of temperature and absolute concentration to perform a more complete corrosion passivation.

SUMMARY OF THE INVENTION

The present invention teaches a two-step process which maximizes the efficiency of chlorine conversion and removal, and hence corrosion resistance. The two steps thereof are:

Surface Saturation, which preferably occurs at conditions of relatively high pressure and low wafer temperature, with no plasma. The high pressure will maximize the concentration of water in the chamber, while the low wafer temperature will allow the surface of the wafer to become saturated. Surface wafer saturation tends to maximize the rate and amount of water diffusing into the sidewall passivation. The lack of plasma exposure prevents the formation of diffusion-inhibiting "crust" layers. The timing of this step can be varied depending on the amount of residual chlorine present on the wafer, i.e. sidewall passivation thickness.

After surface saturation, a Corrosion Cycle "Quench" is performed where the pressure in the reaction vessel is quickly ramped down, and the wafer temperature is quickly ramped up, again with no plasma. The combination of the pressure drop and the concurrent temperature rise result in the rapid removal of both the water and the HCl from the wafer surface and hence breaks the corrosion cycle. The rate and setpoint which the temperature ramps up to, and the rate and setpoint the pressure ramp down to, represent variables which are used to control how quickly the corrosion cycle is halted. The temperature ramp may be achieved with the use of heat lamps, or some other Rapid Thermal Process methodology, and the pressure ramp controlled, for instance, by controlling the chamber throttle valve or pumping speed.

These and other advantages of the present invention will become apparent upon reading the following detailed descriptions and studying the various figures of the Drawing.

BRIEF DESCRIPTION OF THE DRAWING

For more complete understanding of the present invention, reference is made to the accompanying Drawing in the following Detailed Description of the Invention. In the drawing:

FIG. 1 is a cross section through a sidewall including an aluminum line in an integrated circuit, showing a chlorine-rich area prior to passivation.

FIG. 2 is a cross section through the sidewall including the aluminum line in the integrated circuit, showing a chlorine-depleted layer overlying a chlorine rich passivated area.

FIG. 3 is a cross section through the sidewall including the aluminum line in the integrated circuit, showing the effects of the corrosion cycle on the sidewall.

FIG. 4 is a schematic of the actions of the corrosion cycle applied to an aluminum line in an integrated circuit.

Figure 5:
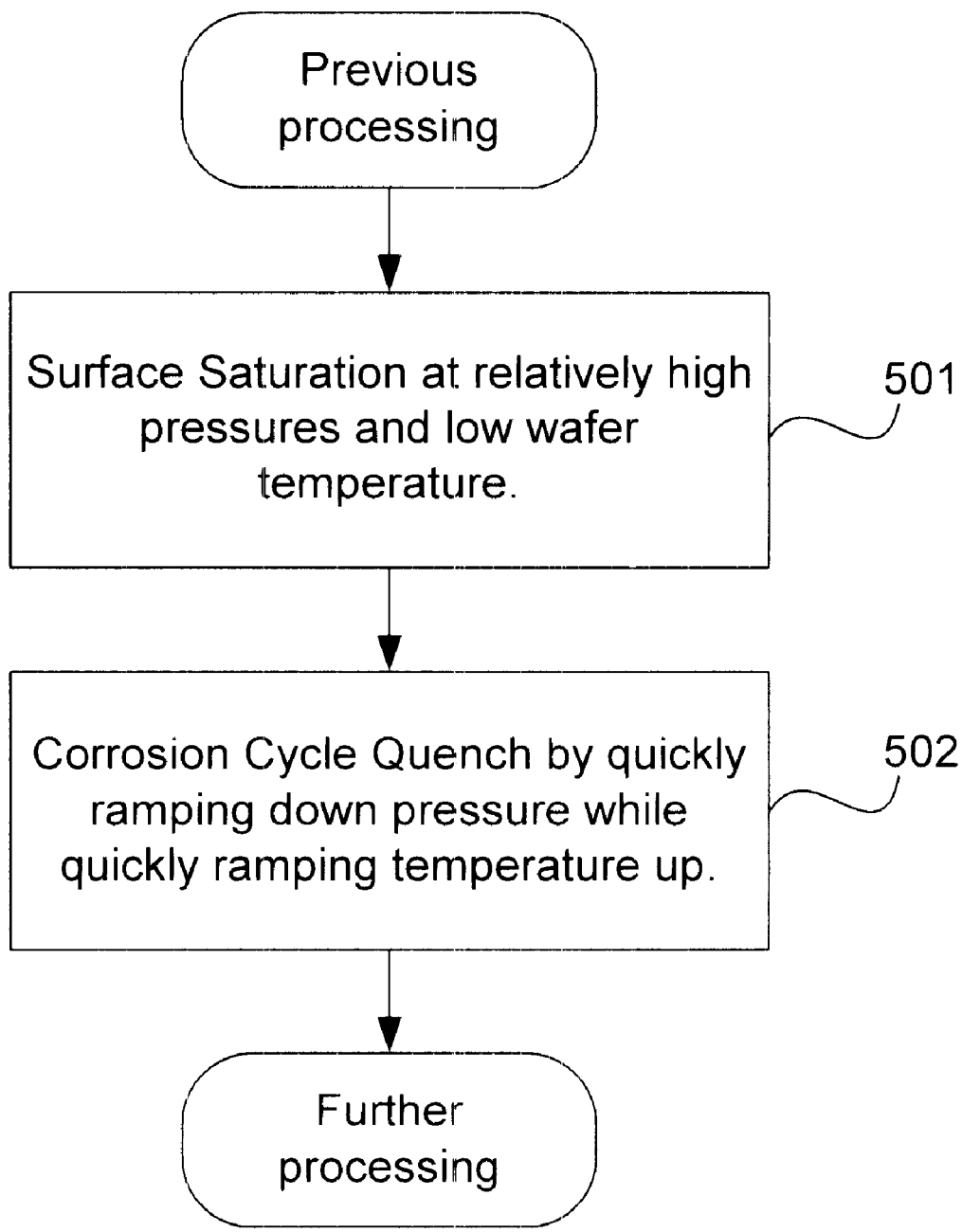
FIG. 5 is a flow chart representation of the process of the present invention.

Reference numbers refer to the same or equivalent parts of the invention throughout the several figures of the Drawing.

DETAILED DESCRIPTION OF THE PREFERRED EMBODIMENT

The preferred embodiment of this invention is to change the typical passivation step into a two-step process which maximizes the efficiency of chlorine conversion and removal, and hence corrosion resistance. Having reference to FIG. 5, the two steps thereof are discussed as follows:

First Step: Surface Saturation. Step 501 preferably occurs at conditions of relatively high pressure and low wafer temperature, with no plasma. The high pressure will maximize the concentration of water in the chamber, while the low wafer temperature will allow the surface of the wafer to become saturated. Surface wafer saturation tends to maximize the rate and amount of water diffusing into the sidewall passivation. The lack of plasma exposure prevents the formation of diffusion-inhibiting "crust" layers. The timing of this step can be varied depending on the amount of residual chlorine present on the wafer, i.e. sidewall passivation thickness. Thicker passivation would mean a longer saturation time. This step will create the conditions that are the most favorable for initiating the corrosion cycle, which will have the effect of maximizing the efficiency/rate of conversion of chlorine to HCl.

Two separate experiments were performed which clearly indicate that creating a plasma in the corrosion passivation step is not necessary for successful corrosion inhibition. Summaries of the experimental results are as follows:

1) Microwave power experiments. Three corrosion tests were performed at different plasma powers: 1400 W, 700 W, and 0 W, the latter representing no plasma. Upon inspection, no corrosion was observed on any of the wafers. These results, especially the "no plasma" test, represents "proof of principle" that corrosion passivation is achievable without a plasma.

2) Microwave Strip Module Characterization: As part of the initial characterization of the microwave stripper, an experiment was performed on the typical $H_2O$ passivation process. The goal of the characterization was to obtain trend information for the photoresist strip rate, uniformity of the photoresist strip, and corrosion performance. The analysis of the results of the experiment revealed that the plasma power had no effect on corrosion performance.

The three process "knobs" for performing the present invention are pressure, temperature, and ramp time. While it is contemplated that a wide variety of low process temperatures may be implemented to form the low wafer temperature of step 501, any temperature above freezing, 0 C., may be implemented. According to another embodiment a range of from 25–60 C. may be used. According to yet another embodiment, substantially any temperature below 275 C. may be utilized, so long as this temperature is lower than the temperature in step 502, following.

Pressures suitable for performing step 501 are from as low as 1 mTorr, or even lower to as high as 10 atmospheres, or even higher. Again, the principle concern here is that the pressure of step 501 be higher than that at step 502.

Second step: Corrosion Cycle "Quench". In step 502 the pressure in the reaction vessel is quickly ramped down, and the wafer temperature is quickly ramped up, again with no plasma. The combination of the pressure drop and the concurrent temperature rise result in the rapid removal of both the water and the HCl from the wafer surface and hence breaks the corrosion cycle. The rate and setpoint which the temperature ramps up to, and the rate and setpoint the pressure ramp down to, represent variables which are used to control how quickly the corrosion cycle is halted. The temperature ramp may be achieved with the use of heat lamps, or some other Rapid Thermal Process methodology, and the pressure ramp controlled, for instance, by controlling the chamber throttle valve or pumping speed.

While it is contemplated that a wide variety of relatively high process temperatures may be implemented to form the high wafer temperature of step 502, any temperature below about 300 C., may be implemented, so long as the temperature is higher than the temperature of step 501. According to another embodiment a range of from 25–60 C. may be used. According to yet another embodiment, substantially any temperature above 0 C. may be utilized, so long is this temperature is higher than the temperature in step 501, preceding.

Pressures suitable for performing step 501 are from as low as 0.1 mTorr, or even lower to as high as 10 atmospheres, or even higher. Again, the principle concern here is that the pressure of step 502 be lower than that at step 501. The principles of the present invention contemplate a decrease in pressure between steps 501 and 502 by factors as low as 2 or even lower or as high as 10 or even higher.

The ramp time between steps 501 and 502 may be as rapid as 1 second or even lower or as slow as one minute or even higher, or substantially any value therebetween. Examples of the latter include ramp times of between 5 seconds and 45seconds, between 10 seconds and 30 seconds and between 15 seconds and 20 seconds. Ramp times may be limited by equipment capability and the wafer's ability to gain temperature, although no experiments have been conducted with a view to determining minimum or maximum ramp times attainable.

Steps 501 and 502 may advantageously be performed in the same reaction vessel or chamber. Alternatively, the steps may be performed in separate vessels or chambers. Finally, either one or both of steps 501 and 502 may be performed in situ within a vessel or chamber utilized for a preceding or succeeding process step.

After steps 501 and 502, the photoresist may be stripped via conventional strip chemistries/processes. This new passivation methodology can occur in the same chamber as the photoresist removal. Alternatively, the methodology taught herein may be implemented in a different chamber.

While it is expected that the specific details of any specific two-step methodology performed in accordance with the teachings of the present invention may be application-dependant, it is nevertheless anticipated that the two-step methodology taught herein is superior to the current methodology in passivation efficiency. This translates into throughput gains and/or improved corrosion resistance.

In summary, the main factors which differentiate this invention from the previous corrosion prevention methodologies are as follows: The present invention does not utilize a plasma, where previous methodologies are plasma processes. The present invention involves relatively high process pressures where the previous methodologies are performed at a relatively low process pressures. The present invention utilizes a ramp down of the process pressure where previous methodologies are performed at constant pressure. The present invention utilizes relatively low wafer temperatures where previous methodologies are performed at relatively high wafer temperatures. Finally, the present invention involves a ramp up of the wafer temperature where previous methodologies are performed at substantially constant wafer temperatures.

The present invention has been particularly shown and described with respect to certain preferred embodiments of features thereof. However, it should be readily apparent to those of ordinary skill in the art that various changes and modifications in form and detail may be made without departing from the spirit and scope of the invention as set forth in the appended claims. In particular, the principles of the present invention specifically contemplate the incorporation of one or more of the various features and advantages taught herein on a wide variety of pressures, temperatures, processing equipment, ramp times, wafer designs, and photoresist strip methodologies. Each of these alternatives is specifically contemplated by the principles of the present invention.

What is claimed is:

1. A post-metal etch corrosion treatment method $C_1$comprising:

surface saturating the wafer, with no plasma; and subsequent to the surface saturation, a corrosion cycle quench, where a pressure in the reaction vessel is quickly ramped down, and the wafer temperature is quickly ramped up, with no plasma so that a plasma free environment is provided from the beginning of the surface saturation until the end of the corrosion cycle quench.

2. The method, as recited in claim 1, wherein a pressure during the surface saturation is between 1 mTorr and 10 atmospheres.

3. The method, as recited in claim 2, wherein the surface saturation maximizes a rate and amount of water diffusing into a sidewall passivation.

4. The method, as recited in claim 3, wherein the time for ramping down the pressure and ramping up the wafer temperature is between 1 second and 1 minute.

5. The method, as recited in claim 4, wherein an absence of plasma prevents formation of diffusion-inhibiting layers.

6. The method, as recited in claim 2, wherein a wafer temperature during the surface saturation is between 25–60° C.

7. A passivation method for passivating HCl on a metal containing layer formed on a wafer, comprising:

provding a surface saturation at a first pressure and a first wafer temperature, which allows a surface of the wafer to become saturated; and providing a corrosion cycle quench, subsequent to the surface saturation, wherein the corrosion cycle quench causes the removal of water and HCl from the surface of the wafer and comprises:

ramping down the pressure to a second pressure below the first pressure;

ramping up the wafer temperature to a second wafer temperature above the first wafer temperature; and providing a plasma free environment around the wafer during the surface saturation and the corrosion cycle quench.

8. The method, as recited in claim 7, wherein the ramping down the pressure and ramping up the wafer temperature occurs within a period of between 1 second and 1minute.

9. The method, as recited in claim 8, wherein the metal layer is an aluminum containing layer.

10. The method, as recited in claim 9, wherein the first pressure is between 1 mTorr and 10 atmospheres.

11. The method, as recited in claim 10, wherein the first temperature is below 275° C.

12. The method, as recited in claim 7, wherein the providing the plasma free environment provides the plasma free environment from a beginning of the providing a surface saturation until an end of the providing a corrosion cycle quench.

13. The method, as recited in claim 7, wherein the providing the plasma free environment provides the plasma free environment from an end of an etch until a beginning of a photoresist strip.

14. The method, as recited in claim 13, wherein the providing the surface saturation maximizes a rate and amount of water diffusing into a sidewall passivation for metallized layers of semiconductor wafers, said method.

* * * * *